United States Patent [19]

Forster et al.

[11] Patent Number: 5,159,576
[45] Date of Patent: Oct. 27, 1992

[54] AUTOMATIC SENSOR IDENTIFICATION FOR ULTRASONIC PROXIMITY SWITCHES

[75] Inventors: Alfred Forster, Schwandorf; Robert Schwarz, Freudenberg, both of Fed. Rep. of Germany

[73] Assignee: Siemens Aktiengesellschaft, Berlin & Munich, Fed. Rep. of Germany

[21] Appl. No.: 788,224

[22] Filed: Nov. 5, 1991

[30] Foreign Application Priority Data

May 11, 1990 [EP] European Pat. Off. ............ 90121132

[51] Int. Cl.$^5$ ........................................ H04B 17/00
[52] U.S. Cl. ..................................................... 367/13
[58] Field of Search ................................ 367/13, 135

[56] References Cited

U.S. PATENT DOCUMENTS 4,259,548 3/1981 Fahey et al. ........................... 379/40

Primary Examiner—Daniel T. Pihulic
Attorney, Agent, or Firm—Kenyon & Kenyon

[57] ABSTRACT

In the case of ultrasonic proximity switch systems having separate evaluation electronics and varying sensor designs, the evaluation parameters must usually be adapted to the particular sensor type. To avoid errors relating to this, it is advantageous when the system is switched over automatically when a new sensor type is connected. Previously, sensor identification has been realized through manual coding or by coupling different voltage levels to a sensor output signal. The aim is to reduce the susceptibility to faults and the expenditure entailed by this method by applying a plurality of sensors. This is achieved in that the oscillator frequency corresponding to the sensor type is indicated with the help of a counter by means of a pulse-width modulated signal, which corresponds to the pulses of the oscillator frequency that are counted according to the counter content. This counter is advantageously accommodated in an integrated circuit, with which a pulse-width modulated signal is already generated as temperature information.

12 Claims, 1 Drawing Sheet

AUTOMATIC SENSOR IDENTIFICATION FOR ULTRASONIC PROXIMITY SWITCHES

BACKGROUND OF THE INVENTION

The present invention relates generally to ultrasonic proximity switches for use with different types of sensors, and more particularly to an ultrasonic proximity switch with an oscillator which oscillates with an oscillator frequency.

In known ultrasonic proximity switches, the received echo is usually evaluated in separate evaluation electronics. To enable ultrasonic proximity switches to operate with different sensor designs, the evaluation parameters in the evaluation electronics must be adapted to the type of sensor being used. To avoid errors, the system is advantageously switched over automatically when a new sensor type is connected.

German Patent 34 28 773 discloses a method of sensor identification which is realized by coupling different voltage levels to a sensor output signal during exactly defined time spans. Other methods use manual coding. However, as more sensors are used and consequently have to be differentiated, these types of sensor identification become all the more costly and interference-prone.

The present invention is directed to the problem of developing an ultrasonic proximity switch, which is simple and reliable regarding the sensor recognition.

SUMMARY OF THE INVENTION

The present invention solves this problem by providing a counter which continuously emits a first signal with a first pulse having a duration that corresponds to the product of the preset counter content and the pulse length of a second pulse of the oscillator frequency supplied to the counter. Since the internal oscillator frequency conforms with the transmitting frequency of the sensor, the sensor being used can be inferred from the knowledge of the transmitting frequency. Accordingly, the first signal bears the information concerning the oscillator frenquency in a corresponding pulse-width modulation.

It proves to be advantageous when the oscillator frequency is able to be applied periodically by means of a switch operated at the transmitting clock pulse to a transmitting stage, and the first pulse is able to be synchronized with the transmitting clock pulse. It is also advantageous when a device is provided, which starts the counter and consequently the first pulse when the transmitting clock pulse has a state change, and when a monoflop which is connected to the counter in outgoing circuit is able to be triggered by the end of the first pulse, whereby at its output the monoflop generates a second signal with a second pulse of a duration corresponding to a physical measured variable. To compensate for the effect of the ambient temperature on the transmission times, it is expendient for the monoflop to be wired to a temperature-sensing device and for the duration of the second pulse to represent the measured temperature of the surrounding medium.

A particularly simple refinement consists in making the counter a component of an integrated circuit, which includes the oscillator. If the monoflop with the temperature-sensing device is a component of the integrated circuit, then additional components and costs can be reduced.

To avoid having unnecessary signal-transmission lines from the ultrasonic proximity switch to the evaluation electronics, it is also advantageous, when a third signal produces both the first pulse with the first pulse duration and also the third pulse with the second pulse duration.

DETAILED DESCRIPTION

Figure 1:
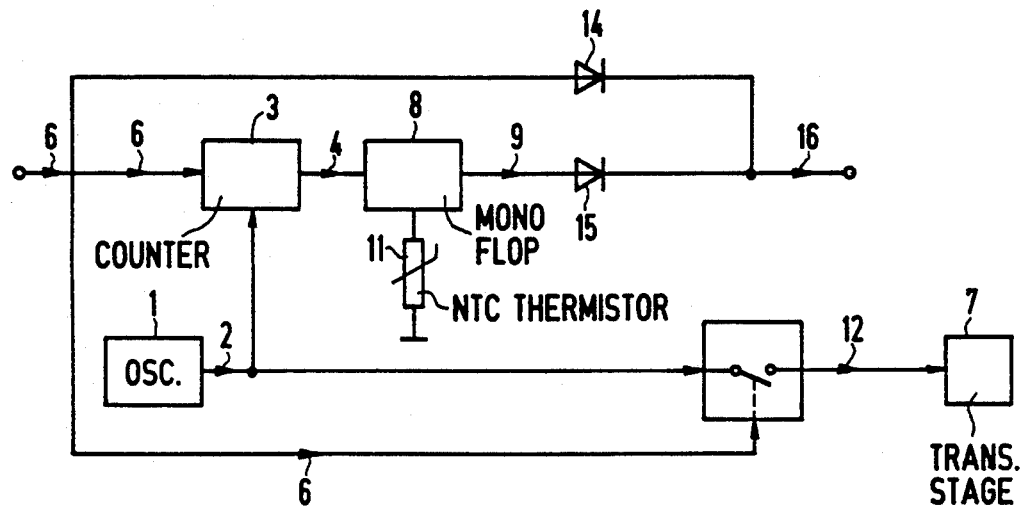
FIG. 1 is an embodiment of the present invention showing improved sensor identification.

In FIG. 1, an oscillator 1 is shown, whose oscillator frequency 2 is applied to a transmitting stage 7 in accordance with a specified transmitting clock pulse 6. The oscillator frequency 2 from the freely oscillating oscillator 1 is fed to a counter 3. The transmitting clock pulse 6 starts the counter 3 via an external device (not shown). The output of the counter 3 is connected to a monoflop 8, which is wired to a temperature-sensing device, in this case to an Negative Temperature Coefficient (NTC) thermistor 11.

Figure 2:
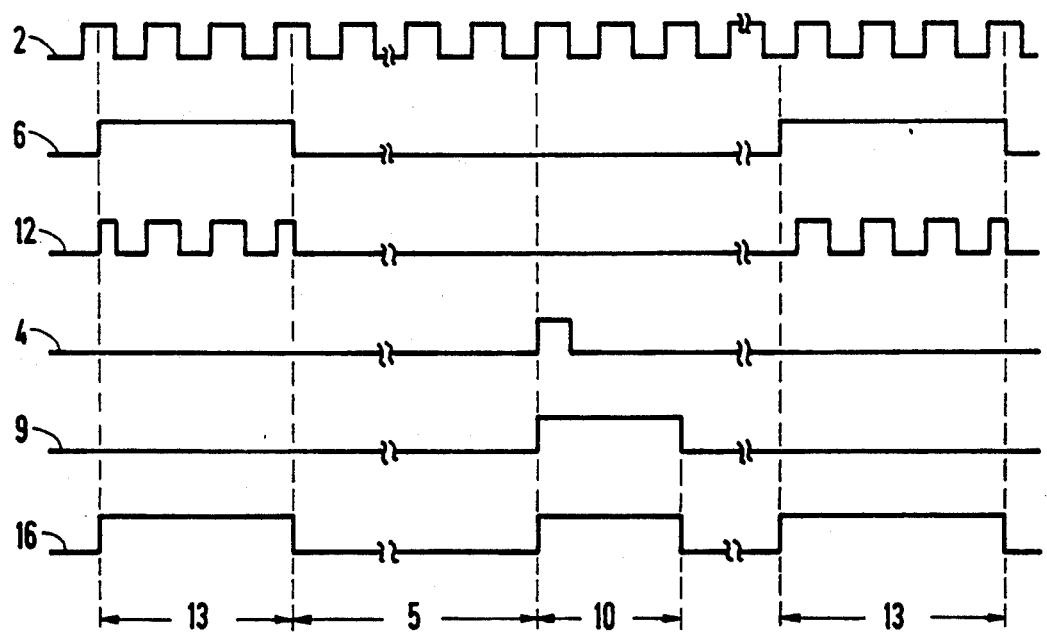
FIG. 2 is a timing diagram of the signals of FIG. 1.

For clarification of this circuit, reference is made to the pulse diagram according to FIG. 2. Here, the oscillator frequency 2 is portrayed. The circuit delivers a transmitting pulse 12, which is clocked by means of the transmitting clock pulse 6 and is fed to the transmitting stage 7. The transmitting pulse 12 covers a transmitting time 13, which repeats itself periodically after a cycle time. As a result of the state change at the end of the transmitting time 13, the counter 3 is started by means of the device which is not depicted. This causes the first pulse to begin to run with the pulse duration 5. In accordance with the preset counter content, the counter 3 counts the pulses of the oscillator frequency 2 fed to it. When the counter content is reached, that is at the end of the first pulse duration 5, the monoflop 8 is triggered as a result of the state change of the first pulse. A signal 4 in accordance with FIG. 2 is applied to the output of the counter 3. By means of the trigger pulse, a third pulse 9 with the pulse duration 10 is introduced, and corresponds to the air temperature measured by the temperature-sensing device with the help of the NTC thermistor 11. This signal is applied to the output of the monoflop 8. By way of the two diodes 14 and 15, the transmitting clock pulse 6 is gated by the output of the monoflop 8, in accordance with signal 9, to third signal 16. This third signal 16 contains information both about the oscillator frequency during the first pulse duration 5 as well as the air temperature during the third pulse with the second pulse duration 10. In application cases in which the oscillator 1 and the circuit elements for the air-temperature sensing 8, 11 are already integrated in a circuit, a simple and cost-effective design approach for additional sensor identification is provided by incorporating an additional counter in the integrated circuit in accordance with the above described circuit arrangement.

What is claimed is:

1. An ultrasonic proximity switch for use with a sensor, which has a sensor type and a typical oscillator frequency, said ultrasonic proximity switch comprising:
 a) an oscillator emitting an oscillator signal having an oscillator frequency and a pulse length; and
 b) a counter being coupled to said oscillator, being set to a preset counter content by a transmitting clock pulse, receiving said oscillator signal and emitting a first signal when operating, said first signal having a first pulse with a duration corresponding to a product of the preset counter content and the pulse length, whereby the duration of the first pulse carries information regarding the sensor type and the typical oscillator frequency.

2. The ultrasonic proximity switch according to claim 1, further comprising a transmitting stage being coupled to the oscillator and a switch being coupled therebetween, said switch being operated by the transmitting clock pulse, whereby the oscillator signal is applied periodically, by means of the switch, to the transmitting stage and the first pulse is synchronous with the transmitting clock pulse.

3. The ultrasonic proximity switch according to claim 2, further comprising:
 a) a monoflop coupled to the counter; and
 b) a means for starting the counter and consequently the first pulse, said starting means being coupled to said counter and starting said counter when the transmitting clock pulse changes state, whereby said monoflop is triggerable by an end of the first pulse, and said monoflop generates a second signal with a second pulse having a duration corresponding to a physical measured variable.

4. The ultrasonic proximity switch according to claim 3, further comprising a temperature sensor coupled to said monoflop, the duration of the second pulse representing a measured temperature of surrounding media.

5. The ultrasonic proximity switch according to claim 4, further comprising:
 a) a first diode receiving said transmitting clock pulse and having an output; and
 b) a second diode being coupled to said monoflop and having an output, wherein the outputs of said first and second diodes are coupled together to form a third signal, which contains the first pulse and the second pulse.

6. The ultrasonic proximity switch according to claim 4, wherein said temperature sensor comprises a negative temperature coefficient thermistor.

7. An ultrasonic proximity switch for use with a sensor, which has a sensor type and a typical oscillator frequency, said ultrasonic proximity switch comprising an integrated circuit including:
 a) an oscillator emitting an oscillator signal having an oscillator frequency and a pulse length; and
 b) a counter being coupled to said oscillator, being set to a preset counter content by a transmitting clock pulse, receiving said oscillator signal and emitting a first signal when operating, said first signal having a first pulse with a duration corresponding to a product of the preset counter content and the pulse length, whereby the duration of the first pulse carries information regarding the sensor type and the typical oscillator frequency.

8. The ultrasonic proximity switch according to claim 7, wherein said integrated circuit further comprises a transmitting stage being coupled to the oscillator and a switch being coupled therebetween, said switch being operated by the transmitting clock pulse, whereby the oscillator signal is applied periodically, by means of the switch, to the transmitting stage and the first pulse is synchronous with the transmitting clock pulse.

9. The ultrasonic proximity switch according to claim 8, wherein said integrated circuit further comprises:
 a) a monoflop coupled to the counter; and
 b) a means for starting the counter and consequently the first pulse, said starting means being coupled to said counter and starting said counter when the transmitting clock pulse changes state, whereby said monoflop is triggerable by an end of the first pulse, and said monoflop generates a second signal with a second pulse having a duration corresponding to a physical measured variable.

10. The ultrasonic proximity switch according to claim 9, wherein said integrated circuit further comprises a temperature sensor coupled to said monoflop, the duration of the second pulse representing a measured temperature of surrounding media.

11. The ultrasonic proximity switch according to claim 10, further comprising:
 a) a first diode receiving said transmitting clock pulse and having an output; and
 b) a second diode being coupled to said monoflop and having an output, wherein the outputs of said first and second diodes are coupled together to form a third signal which contains the first pulse and the third pulse.

12. The ultrasonic proximity switch according to claim 10, wherein said temperature sensor comprises a negative temperature coefficient thermistor.

* * * * *

UNITED STATES PATENT AND TRADEMARK OFFICE
CERTIFICATE OF CORRECTION

PATENT NO. : 5,159,576
DATED : October 27, 1992
INVENTOR(S) : Forster et al.

It is certified that error appears in the above-identified patent and that said Letters Patent is hereby corrected as shown below:

On the title page:[30] Foreign Application Priority Data, please change "May 11, 1990" to --November 5, 1990--.

Signed and Sealed this

Twenty-ninth Day of March, 1994

*Attest:*

BRUCE LEHMAN

*Attesting Officer*     *Commissioner of Patents and Trademarks*